(12) United States Patent
Grivna et al.

(10) Patent No.: US 6,271,106 B1
(45) Date of Patent: Aug. 7, 2001

(54) METHOD OF MANUFACTURING A SEMICONDUCTOR COMPONENT

(75) Inventors: Gordon M. Grivna, Mesa; Richard A. Keating; Gordon C. Ma, both of Phoenix, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/430,725

(22) Filed: Oct. 29, 1999

(51) Int. Cl.$^7$ ..................................... H01L 21/44
(52) U.S. Cl. ..................... 438/570; 438/299; 438/301; 438/592; 438/633; 438/637; 438/655
(58) Field of Search ............... 438/570, 299–307, 438/592–594, 682–683, 655–657, 633–634, 688

(56) References Cited

U.S. PATENT DOCUMENTS

| | | | |
|---|---|---|---|
| 5,447,874 | 9/1995 | Grivna et al. | 437/40 |
| 5,476,801 | * 12/1995 | Keshtbod | 438/264 |
| 5,585,302 | * 12/1996 | Li | 438/384 |
| 5,656,519 | * 8/1997 | Mogami | 438/303 |
| 5,667,632 | 9/1997 | Burton et al. | 438/570 |
| 5,733,806 | 3/1998 | Grivna et al. | 438/183 |
| 6,001,698 | * 12/1999 | Kuroda | 438/303 |
| 6,030,876 | * 2/2000 | Koike | 438/303 |
| 6,063,704 | * 5/2000 | Demirlioglu | 438/664 |
| 6,074,923 | * 6/2000 | Lee | 438/305 |
| 6,080,648 | * 6/2000 | Nagashima | 438/592 |
| 6,117,743 | * 9/2000 | Yeh et al. | 438/301 |
| 6,124,189 | * 9/2000 | Watanabe et al. | 438/586 |

FOREIGN PATENT DOCUMENTS

402027737 * 1/1990 (JP) .......................... H01L/21/336

OTHER PUBLICATIONS

IEEE Transactions On Electron Devices, vol. 42, No. 1, Jan. 1995, Short–Channel–Effect–Suppressed Sub–0.1—μm Grooved–Gate MOSFET's with W gate.
A Comparison of TiN Processes for CVD W/TiN Gate Electrode on 3 nm Gate Oxide, Date Unknown.
A Sub–100nm Gate Length Metal Gate NMOS Transistors Fabricated by a Replacement Gate Process, Date Unknown.
Feasibility of Using W/TiN as Metal Gate for Conventional 0.13 um CMOS Technology and Beyond, 1997 IEEE, pp. 825–828.

* cited by examiner

*Primary Examiner*—Charles Bowers
*Assistant Examiner*—Thanh Nguyen
(74) *Attorney, Agent, or Firm*—Robert F. Hightower

(57) ABSTRACT

A method of manufacturing a semiconductor component includes sequentially disposing a first electrically conductive layer (130), a dielectric layer (140), and a sacrificial layer (150) over a substrate (110). An etch mask is used to defined a gate stack (210) comprised of the sacrificial layer (150), the dielectric layer, and the first electrically conductive layer. Another dielectric layer (310) is deposited over the substrate (110) and the gate stack (210). This second dielectric layer (310) is planarized to expose the sacrificial layer (150). The sacrificial layer (150) of the gate stack (210) and the dielectric layer (140) of the gate stack (210) are sequentially removed, and another electrically conductive layer (740) is deposited over the first electrically conductive layer of the gate stack to form a gate electrode made of, among other features, two electrically conductive layers.

15 Claims, 2 Drawing Sheets

METHOD OF MANUFACTURING A SEMICONDUCTOR COMPONENT

BACKGROUND OF THE INVENTION

This invention relates, in general, to electronics, and more particularly, to methods of manufacturing semiconductor components.

For a semiconductor component to operate at high frequencies, the individual semiconductor devices, such as transistors, in the component must be able to operate at the high frequencies. For transistors to operate at high frequencies, the transistors must have, among other characteristics, short gate lengths, thin gate oxides, low gate resistance, and low parasitic gate capacitance. However, as the gate lengths are reduced, the gate resistance is inherently increased. Therefore, the gate resistance must be independently reduced.

Doped polysilicon is a material that is commonly used for gate electrodes in semiconductor transistors. To reduce the gate resistance, other electrically conductive materials having resistivities lower than that of doped polysilicon have been used to form the gate electrode. For example, tungsten silicide (WSi) has been used to either replace the entire traditional doped polysilicon gate or overlie the doped polysilicon gate. In either configuration, the WSi material may cause contamination problems resulting from the exposure of metals to the high anneal and activation temperatures.

The process where the traditional doped polysilicon gate is replaced entirely with a WSi gate is known in the art as a substitutional or back-filled gate process. The disadvantages of this process include the difficulty to manufacture small gate lengths, unpredictable changes in the work function of the transistor, and reliability problems at the interface between the metal gate and the semiconductor substrate.

The process where a metal layer overlies the doped polysilicon gate is known in the art as a "T"-gate process. The disadvantages of this process include limited scalability and increased parasitic capacitance, which lowers the operating frequency of the transistor.

Accordingly, a need exists for a robust and reliable method of manufacturing a semiconductor component that is capable of operating at high frequencies, has low gate resistance, and has short gate lengths.

BRIEF DESCRIPTION OF THE DRAWINGS

The present invention will be better understood from a reading of the following detailed description, taken in conjunction with the accompanying drawing figures in which.

Figure 1:
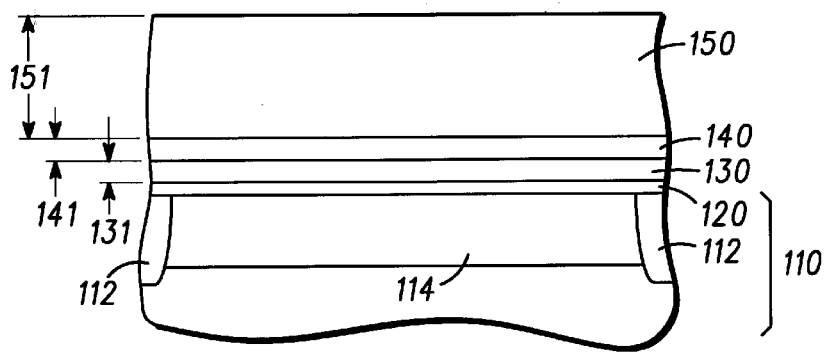
FIGS. 1 through 7 illustrate cross-sectional views of a portion of an embodiment of a semiconductor component during different stages of a manufacturing method in accordance with the present invention.

For simplicity and clarity of illustration, elements in the figures are not necessarily drawn to scale, and the same reference numerals in different figures denote the same elements. Additionally, descriptions and details of well-known features and processing techniques are omitted to avoid unnecessarily obscuring the present invention.

DETAILED DESCRIPTION OF THE DRAWINGS

FIG. 1 illustrates a cross-sectional view of a portion of a semiconductor component 100 after several initial stages of a manufacturing method. Component 100 includes a substrate 110. In the preferred embodiment, substrate 110 is a semiconductor substrate such as, for example, a monocrystalline silicon substrate.

Electrical isolation regions 112 are formed in substrate 110. As an example, isolation regions 112 can be formed by a field oxidation process, as known in the art, or by a trench isolation process, also known in the art. In the preferred embodiment, isolation regions 112 are substantially co-planar with a top surface of substrate 110. This co-planar feature of isolation regions 112 facilitates the manufacturing of component 100.

An active area 114 for a transistor of component 100 is formed in substrate 110 between isolation regions 112. As an example, active area 114 can be formed by an ion implantation process after the formation of isolation regions 112. The dopant in active area 114 can be annealed and activated now or later in the process.

A dielectric layer 120 is formed over the top surface of substrate 110. In the preferred embodiment, layer 120 is a gate oxide layer for the transistor formed in substrate 110. In this embodiment, layer 120 is preferably thermally grown in an oxygen-rich ambient to a thickness of less than approximately 40 nanometers (nm) over the top surface of substrate 110.

Next, layers 130, 140, and 150 are sequentially disposed over layer 120 and substrate 110. In the preferred embodiment, layer 130 serves as a first gate layer for the transistor of component 100. In this embodiment, layer 130 is preferably comprised of an electrically conductive material such as, for example, doped polysilicon. Layer 130 can be deposited over layer 120 using a chemical vapor deposition process and can be doped during or after its deposition. Layer 130 preferably has a thickness 131 of approximately 50–200 nm. Layer 140 serves as an etch stop during the patterning of layer 150, as explained hereinafter. In the preferred embodiment, layer 140 is comprised of silicon dioxide. In this embodiment, layer 140 can be thermally grown to a thickness 141 of approximately 10–30 nm over layer 130. Layer 150 serves as a sacrificial layer, which is preferably entirely removed during subsequent processing, as explained hereinafter. In the preferred embodiment, layer 150 is comprised of the same material as layer 130. For example, when layer 130 is comprised of doped polysilicon, layer 150 can be comprised of doped or undoped polysilicon. Layer 150 has a thickness 151 that is preferably greater than thickness 131 of layer 130. The thickness 151 of layer 150 is preferably approximately 600–1000 nm.

Figure 2:
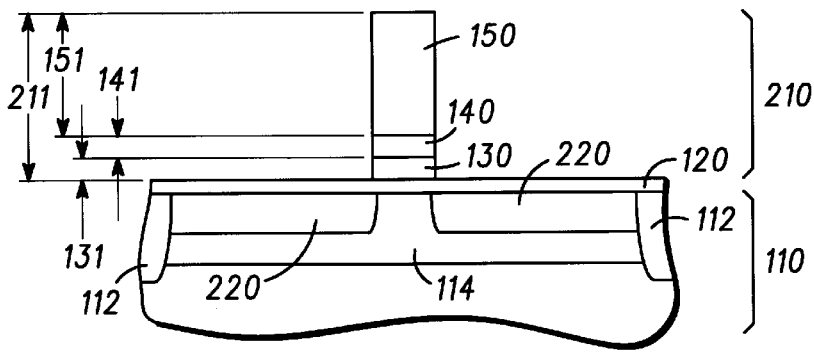

FIG. 2 illustrates a portion of component 100 after subsequent stages of the manufacturing method. An etch mask (not shown in FIG. 2) is formed over layer 150 and is used to define a gate structure or gate stack 210 over layer 120 and the top surface of substrate 110. Gate stack 210 is comprised of portions of layers 150, 140, and 130 and has a combined thickness 211. Layers 150, 140, and 130 are sequentially etched according to the pattern defined by the etch mask. In the preferred embodiment, layer 150 is etched using a dry etchant having a chlorine-based chemistry and having a high etch selectivity to the material of underlying layer 140. Layer 140 serves as an etch stop during this etching of layer 150. After the etching of layer 150, a different etchant such as, for example, a dry etchant comprised of a fluorine-based chemistry that has a high etch selectivity to the material of underlying layer 130 is used to etch layer 140. Subsequently, layer 130 is preferably etched with the same etch chemistry as used previously for layer 150 when layers 130 and 150 are comprised of similar materials. The etch chemistry used to pattern layer 130 should have a high etch selectivity to underlying dielectric layer 120. The etchants used to pattern layers 150, 140, and 130 are preferably anisotropic etchants to provide substantially vertical sidewalls for gate stack 210, which enables precise control of the short submicron gate length for the transistor in component 100.

After the formation of gate stack 210, regions 220 are formed in active area 114. As an example, regions 220 can be formed by an ion implantation process that self-aligns regions 220 to gate stack 210. In the preferred embodiment, regions 220 are self-aligned source and drain regions of the transistor in component 100. Those skilled in the art will understand that the transistor illustrated in FIG. 2 may be modified to include lightly doped source and drain regions, and those skilled in the art will also recognize that the transistor illustrated in FIG. 2 may be modified to be an asymmetric transistor.

Figure 3:
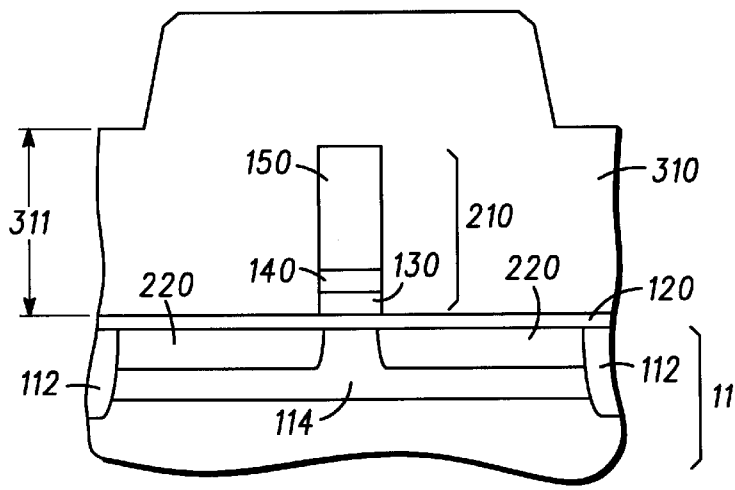

FIG. 3 illustrates component 100 after further stages of the manufacturing method. An electrically insulating layer 310 is formed over gate stack 210, layer 120, and the top surface of substrate 110. Layer 310 is preferably comprised of a dielectric material such as, for example, a silicon oxide or dioxide of tetra-ethyl-ortho-silicate (TEOS) or phosphosilicate glass (PSG) and can be deposited by a single or multiple chemical vapor depositions or other conventional process. Layer 310 preferably has a thickness 311 greater than thickness 211 or the total height of gate stack 210. As an example, thickness 311 can be approximately 1000–1500 nm.

Figure 4:
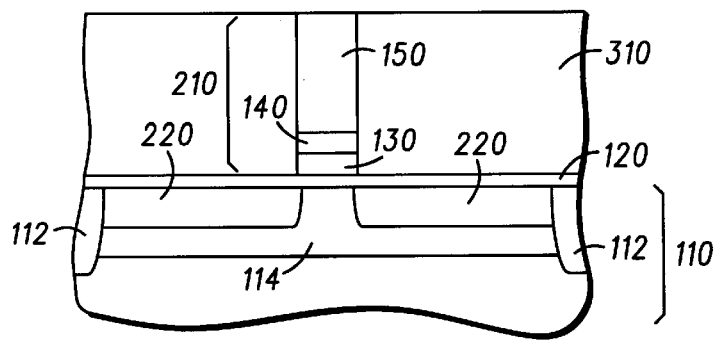

FIG. 4 illustrates a portion of component 100 after still further stages of the manufacturing method. Layer 310 is planarized to expose the portion of layer 150 in gate stack 210. As an example, layer 310 can be planarized by using a chemical-mechanical polishing process (CMP). This CMP process may remove a top portion of layer 150.

Figure 5:
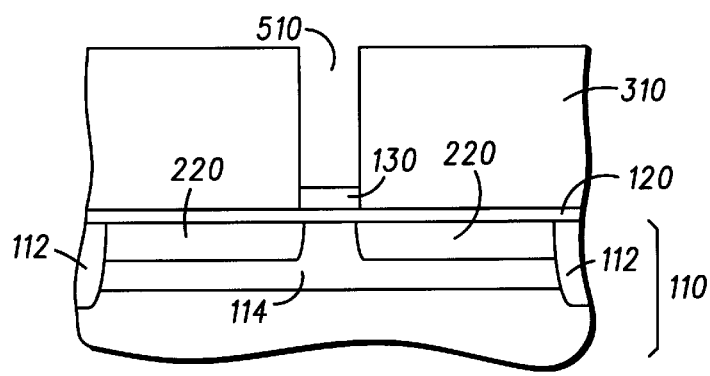

FIG. 5 illustrates a portion of component 100 after additional stages of the manufacturing method. The remaining portions of layers 150 and 140 in FIG. 4 are sequentially removed to provide the illustration of component 100 in FIG. 5. The removal of layers 150 and 140 in the gate stack forms a via 510 in layer 310 that overlies active area 114 and exposes the portion of layer 130 in the gate stack. The preferred complete removal of layer 150 can be accomplished by using an isotropic etchant comprised of nitrogen trifluoride ($NF_3$) that has a high etch selectivity to the material of underlying layer 140. The preferred complete removal of layer 140 can be accomplished by using a reactive ion etching process utilizing a fluorine-based chemistry with a hydrocarbon source to provide high etch selectivity for the material of underlying layer 130.

Figure 6:
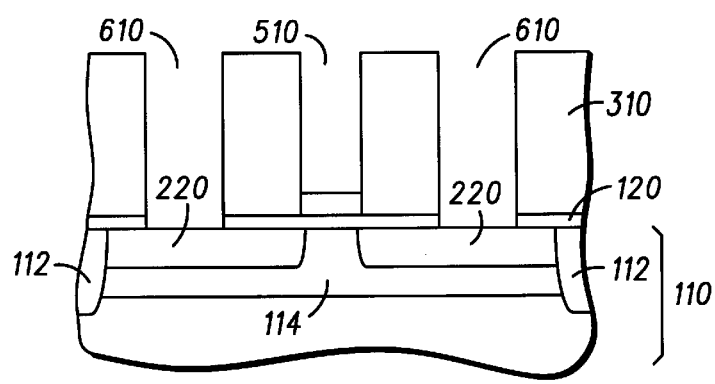

FIG. 6 illustrates a portion of component 100 after subsequent stages of the manufacturing method. Additional vias 610 are etched into layer 310 using an etch mask (not shown in FIG. 6) that defines vias 610. Vias 610 define the locations of the source and drain electrodes of the transistor in component 100. A conventional etching process can be used to form vias 610 in layer 310. The formation of vias 610 also patterns layer 120 to expose the top surface of substrate 110.

Figure 7:
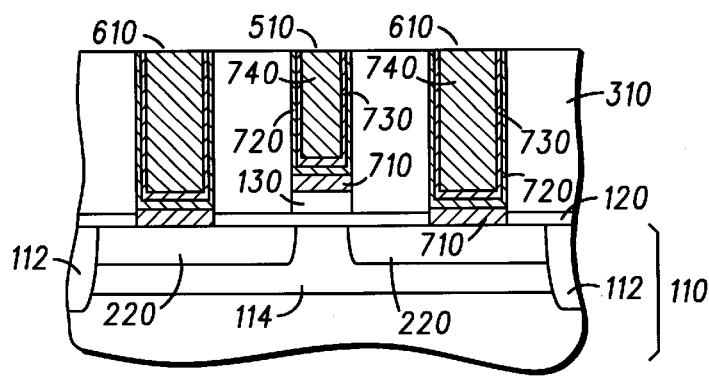

FIG. 7 illustrates a portion of component 100 after even further stages of the manufacturing method. A layer 710 is formed in vias 510 and 610 on the exposed surfaces of substrate 110 and layer 130. As an example, layer 710 is comprised of a silicide such as, for example, titanium silicide, platinum silicide, or cobalt silicide. Layer 710 can be selectively formed at the locations illustrated in FIG. 7 by using conventional silicide processes known in the art.

Next, an electrically conductive layer 720 and a barrier layer 730 are sequentially deposited over layer 710 in vias 510 and 610 and over layer 310. In the preferred embodiment, conductive layer 720 is comprised of an electrically conductive material such as, for example, titanium or titanium tungsten, and barrier layer 730 is comprised of a different electrically conductive material such as, for example, titanium nitride. The deposition of layers 720 and 730 are preferably accomplished by using a columnated deposition process and to provide preferential deposition of layers 720 and 730 at the bottom of via 510.

Layer 740 is deposited onto barrier layer 730 in vias 510 and 610. In the preferred embodiment, layer 740 is an electrically conductive material with very low resistivity such as, for example, tungsten, aluminum, or copper. Next, layers 740, 730, and 720 can be planarized using a CMP process. This planarization process preferably removes substantially all portions of layers 740, 730, and 720 that are not located in vias 510 and 610, as illustrated in FIG. 7.

Layers 740, 730, 720, 710, and 130 in via 510 form a gate electrode for the transistor in component 100. Layers 740, 730, 720, and 710 in via 610 forms source and drain electrodes for the transistor in component 100. Layers 740, 730, 720, and 710 are preferably not formed until after the dopants in source and drain regions 220 and active area 114 are annealed and activated to avoid metallic contamination of substrate 110.

Component 100 is capable of operating at high frequencies because the transistor in FIG. 7 has a low gate resistance and a short gate length. The short gate length is accomplished, as earlier described with reference to FIG. 2, by the anisotropic dry etching process used to pattern layers 150, 140, and 130 to form gate stack 210. The low gate resistance is accomplished by using layer 740, which has a very low resistivity compared to that of layer 130. To further reduce the gate resistance, the thickness of layer 740 is preferably greater than the combined thicknesses of layers 730, 720, 710, and 130.

Therefore, an improved method of manufacturing a semiconductor component is provided to overcome the disadvantages of the prior art. The reliability and robustness of the manufacturing method is improved in several different ways. First, the potential for metal contamination in the semiconductor substrate is substantially reduced because the dopants in the semiconductor substrate are annealed and activated before any metal layers are deposited, as explained hereinbefore. Second, the likelihood of gate oxide contamination or loss and gate-to-substrate interface contamination is significantly reduced because the gate oxide and the underlying substrate are not exposed after the deposition of the first doped polysilicon layer. Third, the submicron gate length is more accurately controlled because the described manufacturing method can use conventional dry anisotropic polysilicon etchants to define the gate length. Fourt, the parasitic gate resistance can be reduced by over tenfold without increasing the parasitic gate capacitance because a T-gate structure is not used. The manufacturing method is also compatible with a multitude of process enhancement options including, but not limited to, spacer-defined gates, simple nonlanded vias, and improved performance inductors.

Moreover, another advantage of the manufacturing process described herein is the improved process control that can be achieved, especially for gates with thin gate oxides. Etching through a thick gate stack such as a thick layer of WSi over a thin layer of polysilicon and stopping on a thinner gate oxide is very difficult due to the large etch selectivity to the oxide that is required during the etching of the overlying thick gate stack. This difficulty is especially important for gate stacks having WSi over polysilicon because WSi etches slower than the polysilicon. Therefore, as the WSi is etched through, the polysilicon begins to etch at a faster etch rate, essentially compounding any etch non-uniformity. Moreover a thicker gate stack worsens the problem. However, using the manufacturing process described herein with a thick gate stack over an etch stop, very thick low resistance gates can be consistently and reliably manufactured because the bulk of the gate etch process is terminated on an etch stop layer without detriment to the underlying gate oxide. The main non-uniformity that remains to be overcome is for that of the thin polysilicon layer, which can be achieved by using a very short overetch capable of clearing any remaining exposed polysilicon while preserving the underlying thin gate oxide.

The disclosure of the present invention described herein is enabled and can be realized and practiced without undue experimentation. Although the best mode of carrying out the present invention contemplated by the inventors is disclosed hereinabove, practice of the present invention is not limited thereto. Furthermore, while the present invention has been particularly shown and described mainly with reference to specific embodiments, it will be understood by those skilled in the art that various changes in form and detail may be made to the embodiments herein without departing from the spirit or scope of the present invention. For instance, the numerous details set forth herein such as, for example, the material compositions and layer thicknesses are provided to facilitate the understanding of the present invention and are not provided to limit the scope of the present invention. Furthermore, while the method is described mainly in reference to a silicon device, one skilled in the art will understand that modifications may be made to this method to manufacture a compound semiconductor device. Moreover, while a single transistor is illustrated in FIGS. 1–7, one skilled in the art will understand that the semiconductor component may have a plurality of such transistors and when a plurality of transistors is used, the semiconductor component can include a multilayered interconnect scheme to electrically couple the plurality of transistors together.

Accordingly, the disclosure of the present invention is not intended to be limiting. Instead, the disclosure of the present invention is intended to be illustrative of the scope of the present invention. It is intended that the scope of the present invention shall be limited only to the extent required by the appended claims and the rules and principles of applicable law. Furthermore, the appended claims are not to be interpreted as including means-plus-function limitations, unless such a limitation is expressly recited in a given claim using the phrase "means for".

What is claimed is:

1. A method of manufacturing a semiconductor component comprising:
    providing a substrate;
    disposing a first layer over the substrate;
    disposing an etch stop layer over the first layer;
    disposing a sacrificial layer over the etch stop layer;
    patterning the sacrificial layer, the etch stop layer, and the first layer to form a gate stack comprising a portion of the first layer, a portion of the etch stop layer, and a portion of the sacrificial layer;
    disposing a dielectric layer over the substrate and the gate stack;
    exposing the portion of the sacrificial layer after disposing the dielectric layer;
    removing the portion of the sacrificial layer to create a via in the dielectric layer;
    disposing a barrier layer on the first layer in the via wherein the barrier layer does not extend onto sidewalls of the via;
    disposing a conductor layer onto the barrier layer; and
    disposing a metal layer onto the conductor layer.

2. The method of claim 1 wherein disposing the first layer further comprises providing a first electrically conductive gate layer for the first layer.

3. The method of claim 1 wherein disposing the first layer further comprises providing polysilicon for the first layer,
    wherein disposing the etch stop layer further comprises thermally growing silicon dioxide for the etch stop layer,
    wherein disposing the sacrificial layer further comprises providing polysilicon for the sacrificial layer, and
    wherein disposing the dielectric layer further comprises providing silicon oxide for the dielectric layer.

4. The method of claim 1 wherein patterning the sacrificial layer, the etch stop layer, and the first layer further comprises using a single etch mask to define the gate stack.

5. The method of claim 1 wherein patterning the sacrificial layer, the etch stop layer, and the first layer occurs after disposing the sacrificial layer.

6. The method of claim 1 wherein disposing the first layer further comprises providing the first layer with a first thickness, and
    wherein disposing the sacrificial layer further comprises providing the sacrificial layer with a second thickness greater than the first thickness.

7. The method of claim 6 wherein disposing the first layer further comprises providing a material for the first layer, and
    wherein disposing the sacrificial layer further comprises providing the material for the sacrificial layer.

8. The method of claim 1 wherein exposing the portion of the sacrificial layer further comprises chemically-mechanically polishing the dielectric layer to expose the portion of the sacrificial layer.

9. The method of claim 1 further comprising removing the portion of the etch stop layer after removing the portion of the sacrificial layer, wherein removing the portion of the sacrificial layer further comprises exposing the portion of the etch stop layer.

10. The method of claim 9, wherein removing the portion of the etch stop layer occurs after exposing the portion of the sacrificial layer and before disposing the metal layer.

11. The method of claim 1 further comprising forming an active area in the substrate, wherein disposing the metal layer further comprises using the metal layer in the via to form a portion of a gate electrode over the active area.

12. The method of claim 11 wherein patterning the first layer, the etch stop layer, and the sacrificial layer further comprises using the portion of the first layer to form an additional portion of the gate electrode wherein the portion of the first layer is located underneath the metal layer in the via after disposing the metal layer in the via.

13. A method of manufacturing a semiconductor component comprising:
    providing a silicon substrate;
    growing a first silicon dioxide layer over the silicon substrate;
    depositing a first polysilicon layer over the first silicon dioxide layer, the first polysilicon layer being doped;

growing a second silicon dioxide layer over the first polysilicon layer;

depositing a second polysilicon layer over the second silicon dioxide layer;

sequentially etching the second polysilicon layer, the second silicon dioxide layer, and the first polysilicon layer to form a gate structure over the silicon substrate after depositing the second polysilicon layer, the gate structure comprised of a portion of the second polysilicon layer defined by an etch mask, a portion of the second silicon dioxide layer defined by the etch mask, and a portion of the first polysilicon layer defined by the etch mask;

depositing a third silicon dioxide layer over the silicon substrate and the gate structure;

chemically-mechanically polishing the third silicon dioxide layer to expose the portion of the second polysilicon layer;

removing the portion of the second polysilicon layer to form a via in the third silicon dioxide layer;

removing the portion of the second silicon dioxide layer after removing the portion of the second polysilicon layer to extend the via deeper into the third silicon dioxide layer and to expose the portion of the first polysilicon layer;

forming a silicide in the via;

depositing a conductor layer onto the silicide in the via before depositing the metal; and depositing a barrier layer onto the conductor layer in the via before depositing the metal; and depositing a metal onto the barrier layer.

14. The method of claim 13 further comprising:

implanting a dopant into the silicon substrate after sequentially etching the second polysilicon layer, the second silicon dioxide layer, and the first polysilicon layer and before depositing the third silicon dioxide layer;

activating the dopant before depositing the metal;

etching additional vias into the third silicon dioxide layer to expose portions of the silicon substrate after removing the portion of the second silicon dioxide layer and before depositing the metal;

simultaneously forming another silicide in the additional vias on the portions of the silicon substrate while forming the silicide in the via;

depositing the conductive layer onto the silicide in the additional vias before depositing the metal; and depositing the barrier layer onto the conductive layer in the additional vias before depositing the metal, wherein depositing the metal further comprises depositing the metal onto the barrier layer in the via and the additional vias.

15. The method of claim 13 wherein depositing the second polysilicon layer further comprises providing the second polysilicon layer with a thickness greater than a thickness of the first polysilicon layer, wherein removing the portion of the second silicon dioxide layer further comprises simultaneously removing a portion of the third silicon dioxide layer, and wherein depositing the metal further comprises selecting the metal from the group consisting of tungsten, aluminum, and copper.

* * * * *